(12) United States Patent
Hondo

(10) Patent No.: US 10,379,645 B2
(45) Date of Patent: Aug. 13, 2019

(54) WIRING BODY, WIRING BOARD, TOUCH SENSOR AND METHOD FOR PRODUCING WIRING BODY

(71) Applicant: FUJIKURA LTD., Tokyo (JP)

(72) Inventor: Takaharu Hondo, Chiba (JP)

(73) Assignee: FUJIKURA LTD., Tokyo (JP)

( * ) Notice: Subject to any disclaimer, the term of this patent is extended or adjusted under 35 U.S.C. 154(b) by 56 days.

(21) Appl. No.: 15/508,310

(22) PCT Filed: Dec. 25, 2015

(86) PCT No.: PCT/JP2015/086271
§ 371 (c)(1),
(2) Date: Mar. 2, 2017

(87) PCT Pub. No.: WO2016/104723
PCT Pub. Date: Jun. 30, 2016

(65) Prior Publication Data
US 2017/0285786 A1    Oct. 5, 2017

(30) Foreign Application Priority Data

Dec. 26, 2014    (JP) .................. 2014-264492

(51) Int. Cl.
*G06F 3/041* (2006.01)
*H05K 3/20* (2006.01)
(Continued)

(52) U.S. Cl.
CPC .............. *G06F 3/041* (2013.01); *H05K 3/20* (2013.01); *H05K 3/207* (2013.01); *H05K 3/386* (2013.01); *G06F 3/044* (2013.01); *G06F 2203/04103* (2013.01); *H05K 1/0274* (2013.01); *H05K 1/092* (2013.01); *H05K 3/1275* (2013.01); *H05K 2201/0108* (2013.01); *H05K 2201/09681* (2013.01); *H05K 2201/09827* (2013.01);
(Continued)

(58) Field of Classification Search
CPC ...... G06F 3/041; H05K 9/0096; Y10T 428/31
See application file for complete search history.

(56) References Cited

U.S. PATENT DOCUMENTS 5,201,268 A    4/1993  Yamamoto et al.
5,609,704 A    3/1997  Hayama et al.
(Continued)

FOREIGN PATENT DOCUMENTS

CN    102971806 A    3/2013
CN    103465525 A    12/2013
(Continued)

OTHER PUBLICATIONS

Japanese Official Action issued in application No. 2016-532147 dated Jul. 12, 2016 (3 pages).
(Continued)

*Primary Examiner* — Kevin M Nguyen
(74) *Attorney, Agent, or Firm* — Osha Liang LLP

(57) ABSTRACT

A wiring body includes an adhesive layer and a conductor pattern bonded to the adhesive layer. A surface roughness of an adhesive surface in the conductor pattern bonded to the adhesive layer is rougher than a surface roughness of another surface, which is a surface of the conductor pattern except for the adhesive surface in the conductor pattern.

16 Claims, 8 Drawing Sheets

(51) Int. Cl.
*H05K 3/38* (2006.01)
*G06F 3/044* (2006.01)
*H05K 1/02* (2006.01)
*H05K 1/09* (2006.01)
*H05K 3/12* (2006.01)

(52) U.S. Cl.
CPC ............ *H05K 2203/0113* (2013.01); *H05K 2203/0502* (2013.01)

(56) References Cited

U.S. PATENT DOCUMENTS

| | | | |
|---|---|---|---|
| 6,310,304 | B1 | 10/2001 | Hayama et al. |
| 6,378,424 | B1 | 4/2002 | Hayama et al. |
| 2006/0237229 | A1 | 10/2006 | Sugahara |
| 2008/0096022 | A1* | 4/2008 | Naito ............... H05K 9/0096 428/409 |
| 2008/0098596 | A1 | 5/2008 | Kim et al. |
| 2008/0135283 | A1 | 6/2008 | Hibino et al. |
| 2009/0047539 | A1 | 2/2009 | Dobashi et al. |
| 2010/0007827 | A1 | 1/2010 | Nishimura et al. |
| 2010/0021695 | A1 | 1/2010 | Naoyuki et al. |
| 2010/0230154 | A1 | 9/2010 | Naito et al. |
| 2011/0122596 | A1* | 5/2011 | Miyazaki ......... H05K 9/0096 361/818 |
| 2011/0185566 | A1 | 8/2011 | Sugahara |
| 2012/0160560 | A1* | 6/2012 | Kajiya ................. B32B 3/30 174/70 R |
| 2013/0129465 | A1 | 5/2013 | Okazaki et al. |
| 2014/0054070 | A1 | 2/2014 | Ichiki |
| 2015/0223328 | A1 | 8/2015 | Endoh et al. |
| 2015/0251393 | A1 | 9/2015 | Kanna et al. |

FOREIGN PATENT DOCUMENTS

| | | |
|---|---|---|
| JP | H04-240792 A | 8/1992 |
| JP | H07-169635 A | 7/1995 |
| JP | 2006-302930 A | 11/2006 |
| JP | 2007-324426 A | 12/2007 |
| JP | 2008-139730 A | 6/2008 |
| JP | 2011-139097 A | 7/2011 |
| JP | 2011-171650 A | 9/2011 |
| JP | 2012-155369 A | 8/2012 |
| JP | 2012-168301 A | 9/2012 |
| JP | 2012-185813 A | 9/2012 |
| JP | 2013147755 A | 8/2013 |
| JP | 2013-232244 A | 11/2013 |
| TW | 200826770 A | 6/2008 |
| TW | 201407643 A | 2/2014 |
| WO | 2008/149969 A1 | 12/2008 |
| WO | 2014/084112 A1 | 6/2014 |

OTHER PUBLICATIONS

Taiwanese Official Action issued in application No. 104143738 dated Oct. 24, 2016 (8 pages).
Japanese Official Action issued in application No. 2014-264492 dated Sep. 15, 2015 (3 pages).
Extended European Search Report in counterpart European Application No. 15 873 291.7 dated Sep. 22, 2017 (10 pages).
Chinese Official Action issued in application No. 201580047455.1 dated Mar. 26, 2019 with English Translation (16 pages).

\* cited by examiner

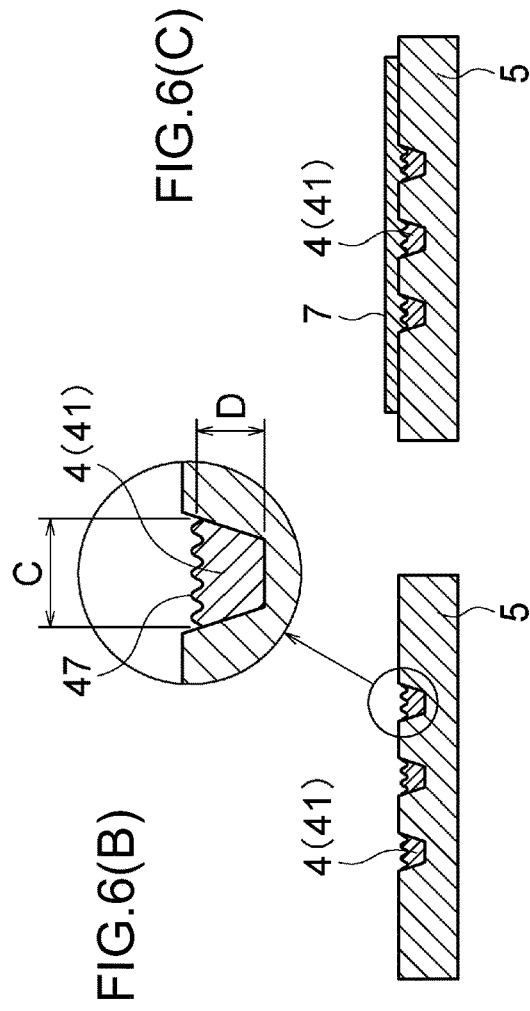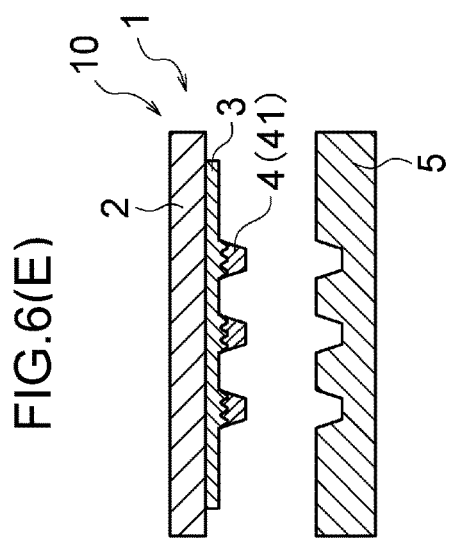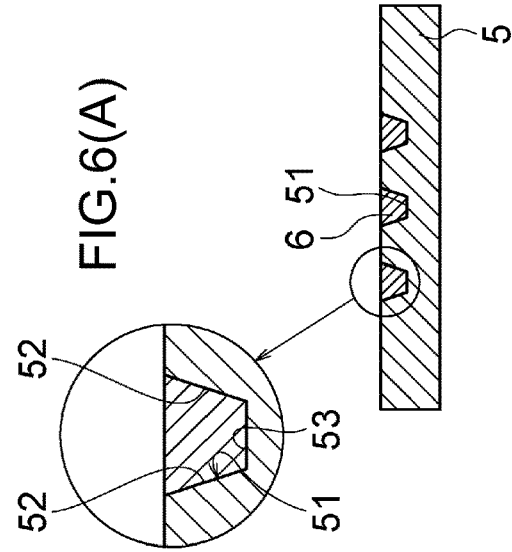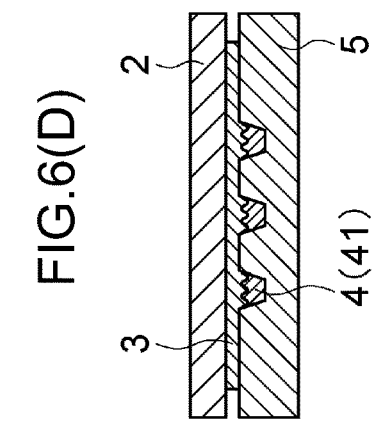

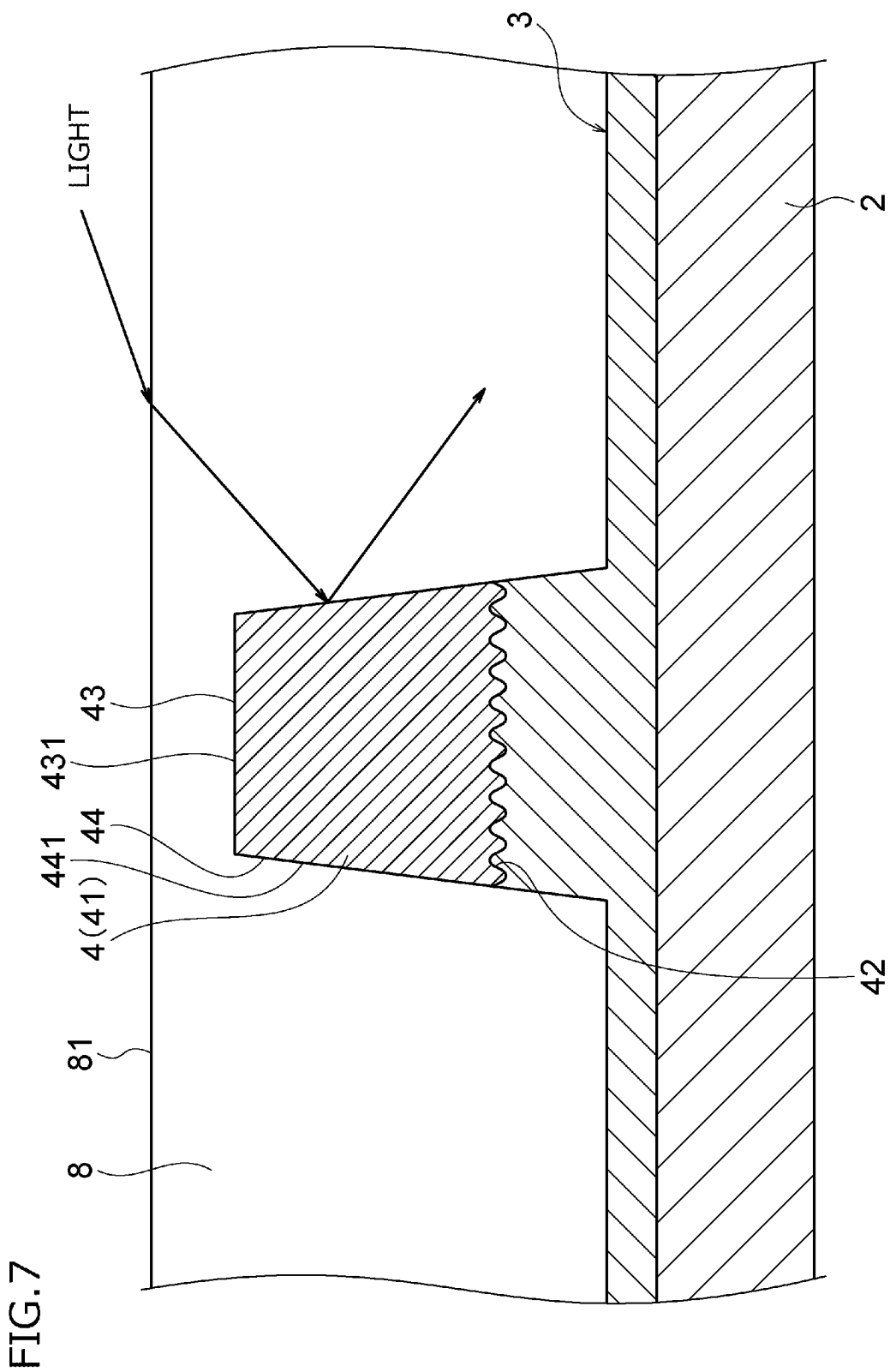

WIRING BODY, WIRING BOARD, TOUCH SENSOR AND METHOD FOR PRODUCING WIRING BODY

TECHNICAL FIELD

The present invention relates to a wiring body, a wiring board, a touch sensor, and a method for producing the wiring body.

In designated nations where incorporation of documents by reference is accepted, the contents disclosed in Japanese Patent Applications No. 2014-264492, filed on Dec. 26, 2014 in Japan is incorporated by reference into this specification, and is regarded as a part of disclosure of this specification.

BACKGROUND ART

There has been a known conductor wiring pattern formed by filling intaglio with a conductor material, transferring the conductor material to transfer-receiving substrate using an offset printing scheme, and heating them (for example, see Patent Document 1).

In addition, as a electromagnetic shielding material, there is known one having a conductive layer formed by pressing a printing plate having a depression of a predetermined pattern filled with an uncured conductive composition and one surface of a substrate to which the conductive composition is transferred through an uncured primer layer, transferring the conductive composition onto the primer layer, and performing hardening treatment on the conductive composition (for example, see paragraph [0087] of Patent Document 2).

CITATION LIST

Patent Document

Patent Document 1: JP 2007-324426 A
Patent Document 2: WO 2008/149969 A

SUMMARY OF THE INVENTION

Problem to be Solved by the Invention

The conductor wiring pattern or the conductive layer of the electromagnetic shielding material described above is formed by performing hardening/heating treatment after transferring the conductor material (conductive composition), and thus a concave-convex shape originating from conductive particles included in the conductor material is generated on a surface of the conductor wiring pattern. For this reason, there is a problem that light entering from the outside is diffused on the surface of the conductor wiring pattern. Meanwhile, even when surface roughness of the whole conductor wiring pattern is reduced to suppress diffused reflection, there is a problem that there is difficulty in strongly bonding the conductor material and the substrate together.

Problems to be solved by the present invention include providing a wiring body, a wiring board, a touch sensor, and a method for producing the wiring body capable of suppressing diffused reflection of light entering from the outside while stringing bonding an insulating member and a conductor pattern together.

Means for Solving Problem

[1] A wiring body according to the invention includes an insulating member, and a conductor pattern bonded to the insulating member, wherein a surface roughness of an adhesive surface of the conductor pattern bonded to the insulating member is rougher than a surface roughness of another surface which is a surface of the conductor pattern except for the adhesive surface in the conductor pattern.

[2] In the above invention, the following Formula (1) may be satisfied.

$$0.5 \leq B/A \qquad (1)$$

in the Formula (1), A denotes a maximum width of the conductor pattern in a section view, and B denotes a maximum height of the conductor pattern in the section view.

[3] In the above invention, the other surface may include a top portion positioned on an opposite side to the adhesive surface, and the top portion may include a flat portion.

[4] In the above invention, the other surface may include a top portion positioned on an opposite side from the adhesive surface, and a side portion positioned between the adhesive surface and the top portion, and the side portion may be inclined such that the side portion approaches a center of the conductor pattern as the side portion is away from the insulating member in a section view.

[5] The side portion may be formed in a convex shape in the direction away from the insulating member.

[6] In the above invention, an angle θ between the top portion and the side portion may be within a range of 90° to 120°.

[7] In the above invention, the side portion may include a first portion connected to the top portion in the section view, and a second portion positioned on an outside of the first portion and connected to the adhesive surface in the section view, and the side portion may substantially match a virtual straight line passing through the first and second portions in the section view, or protrudes outward from the virtual straight line in the section view.

[8] In the above invention, the conductor pattern may contain conductive particles, and an average diameter of the conductive particles may be half or less a width of the conductor pattern.

[9] In the above invention, the width of the conductor pattern may be within a range of 1 μm to 5 μm.

[10] In the above invention, a diffused reflectance of the wiring body on a side of the other surface may be relatively smaller than a diffused reflectance of the wiring body on a side of the adhesive surface.

[11] A wiring board according to the invention includes the wiring body and a support that supports the wiring body.

[12] A touch sensor according to the invention includes the wiring board.

[13] A method for producing a wiring body according to the invention includes a first process of filling a recessed portion of intaglio with an electrically conductive material, a second process of forming a concave-convex shape on an upper surface of the electrically conductive material by performing at least one of drying, heating, and irradiating with an energy ray the electrically conductive material filling the intaglio, a third process of introducing an insulating material into the concave-convex shape, and a fourth process of releasing at least the insulating material and the electrically conductive material from the intaglio.

[14] In the above invention, the third process may include a process of disposing a substrate on the insulating material introducing into the concave-convex shape, and the fourth process may be a process of releasing the substrate, the insulating material, and the electrically conductive material from the intaglio while the electrically conductive material is fixed to the substrate through the insulating material.

[15] In the above invention, the following Formula (2) may be satisfied.

$$0.5 \leq D/C \quad (2)$$

in the Formula (2), C denotes a maximum width of the electrically conductive material on which at least one of drying, heating, and irradiation with an energy ray is performed in a section view, and D denotes a maximum height of the electrically conductive material which is heated or irradiated with the energy ray in the section view.

[16] In the above invention, an inner wall of the recessed portion may include a flat surface.

[17] In the above invention, the flat surface may be inclined with respect to the upper surface.

[18] In the above invention, an inner surface shape of the recessed portion may include a surface which is convex toward a bottom surface.

Effect of the Invention

According to the invention, since a surface roughness of an adhesive surface of a conductor pattern bonded to an insulating member is rougher than a surface roughness of another surface except for the adhesive surface in the conductor pattern, it is possible to suppress diffused reflection of light entering from the outside while strongly bonding an insulating member and a conductor pattern together.

BRIEF DESCRIPTION OF DRAWINGS

FIGS. 6(A) to 6(E) are cross-sectional views illustrating a method for producing the wiring board in the embodiment of the invention.

FIG. 7 is a cross-sectional view for description of an effect of the wiring board in the embodiment of the invention.

MODE(S) FOR CARRYING OUT THE INVENTION

Hereinafter, an embodiment of the invention will be described with reference to drawings.

Figure 1:
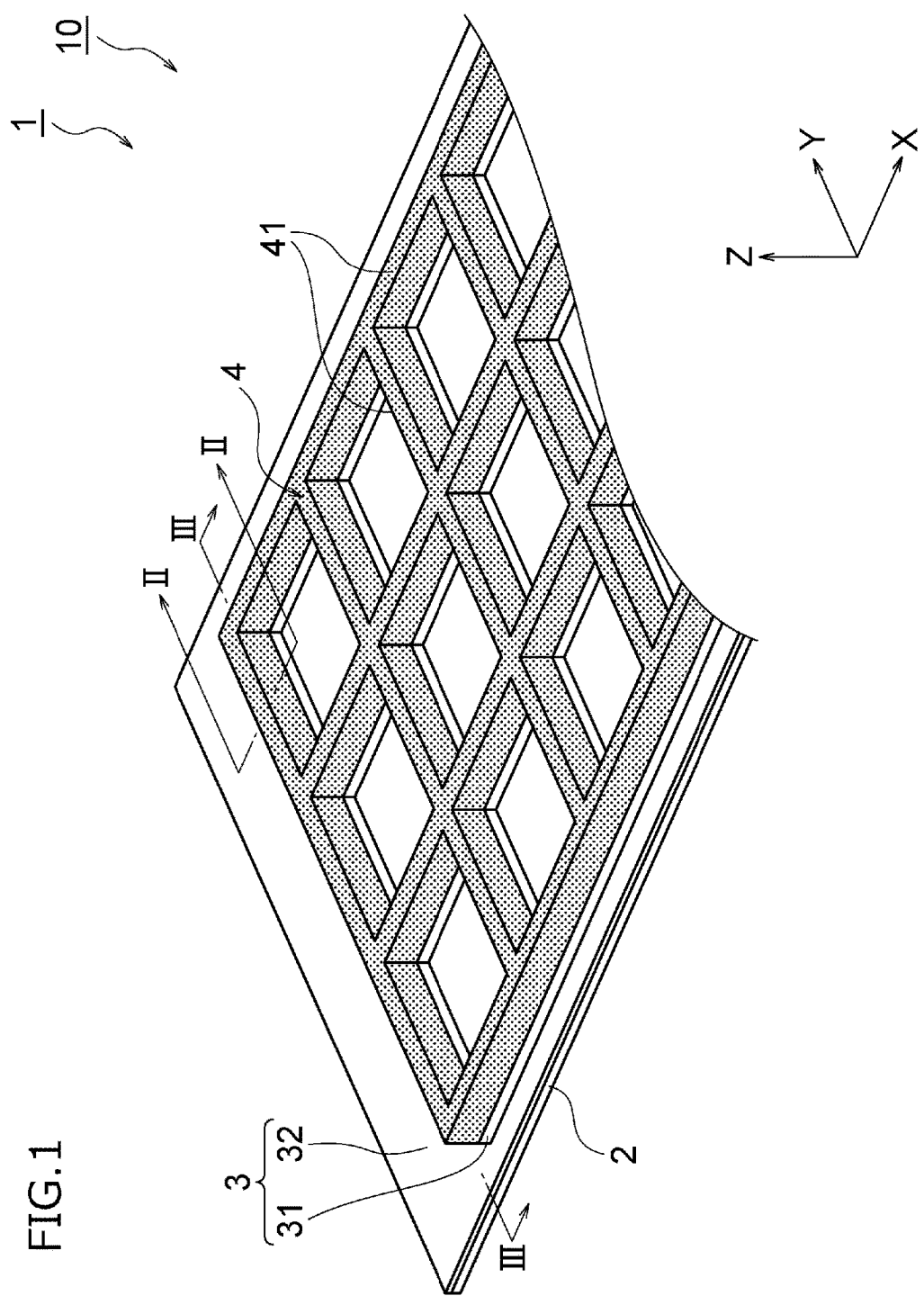
FIG. 1 is a perspective view illustrating a wiring board according to an embodiment of the invention.
Figure 2:
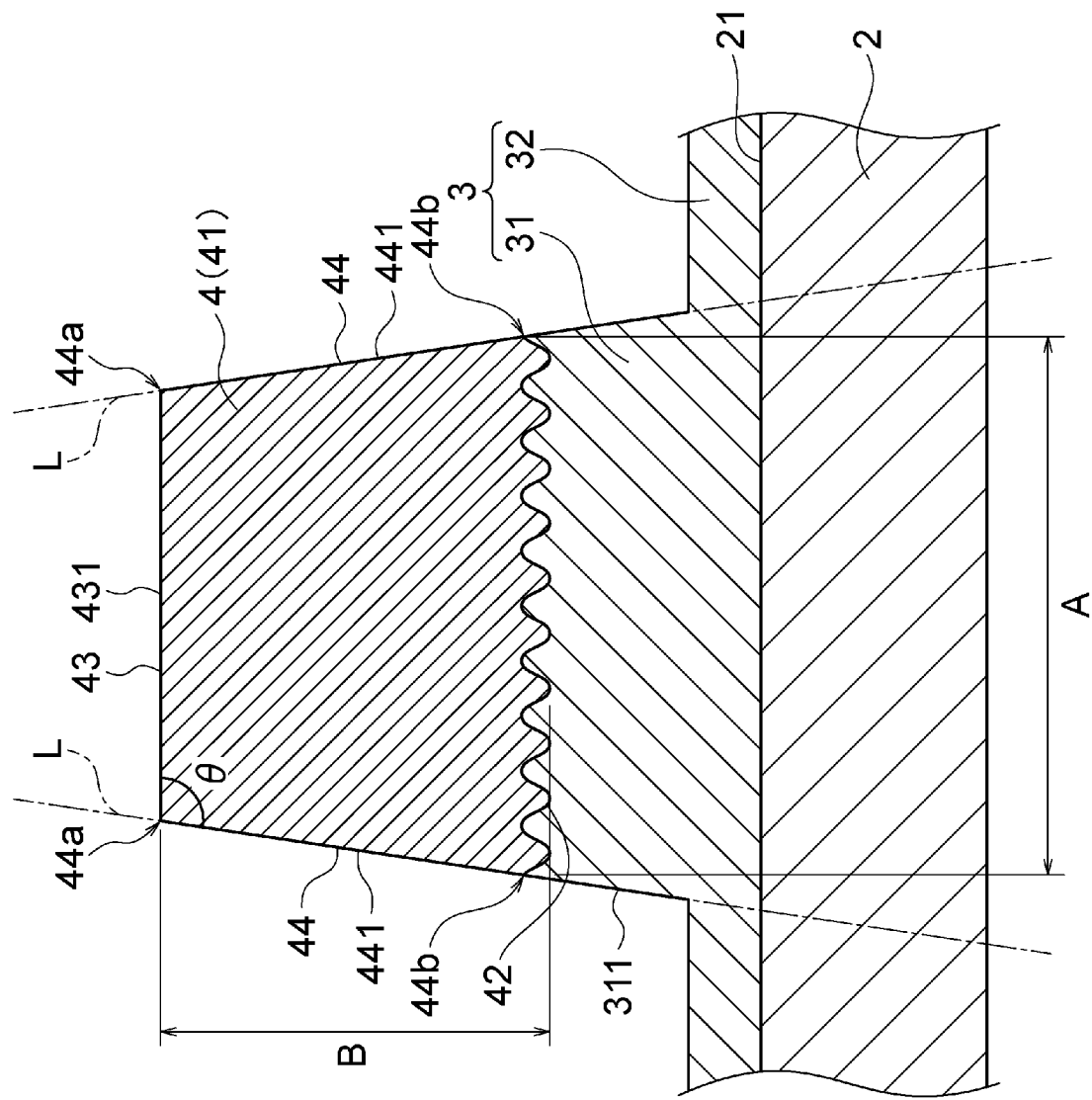
FIG. 2 is a cross-sectional view taken along II-II line of FIG. 1.
Figure 3:
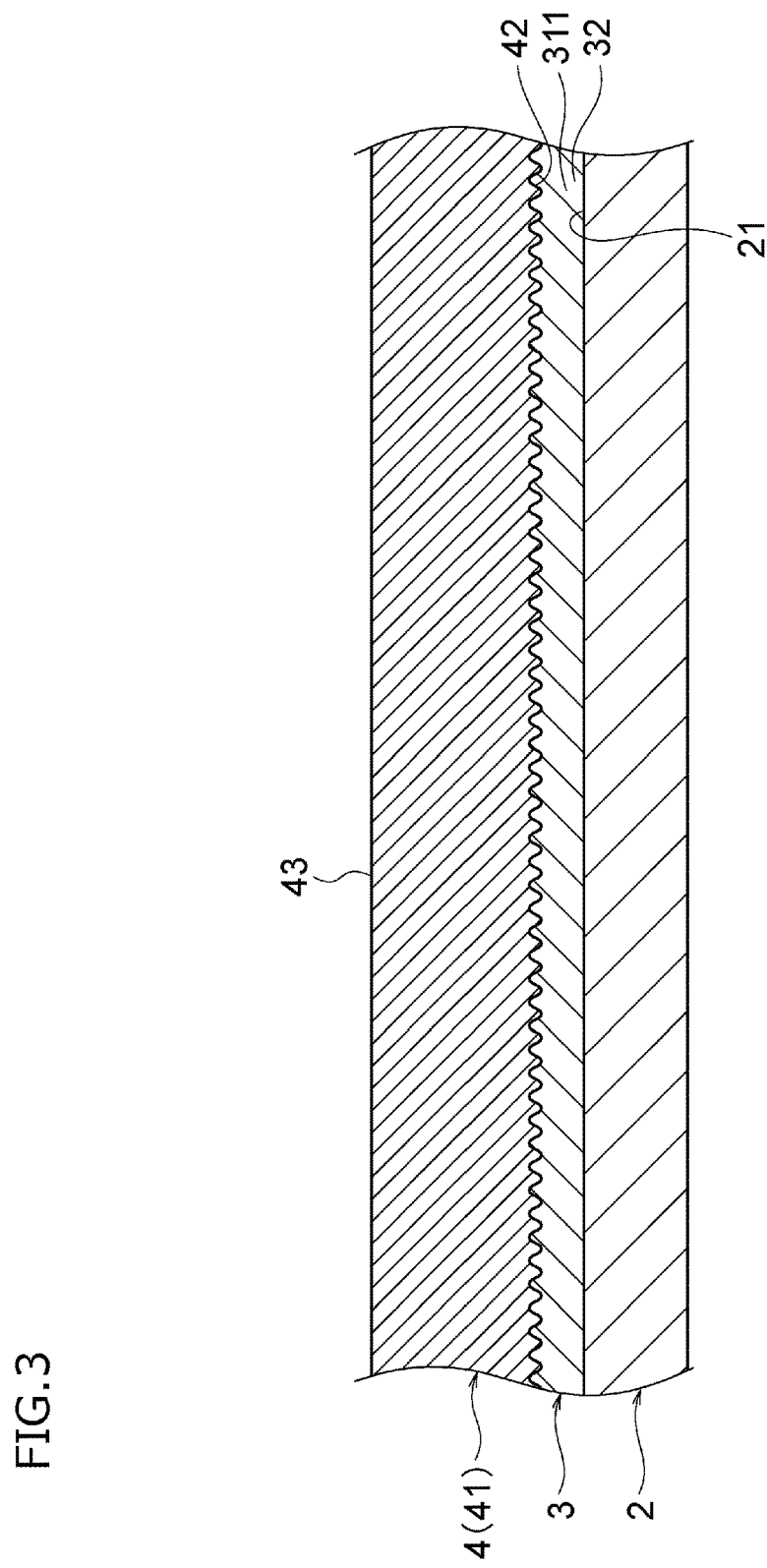
FIG. 3 is a cross-sectional view taken along III-III line of FIG. 1.

FIG. 1 is a perspective view illustrating a wiring board in an embodiment, FIG. 2 is a cross-sectional view taken along II-II line of FIG. 1, FIG. 3 is a cross-sectional view taken along III-III line of FIG. 1, and FIGS. 4(A) to 4(C) are cross-sectional views illustrating first to third modified examples of a wiring body in the embodiment of the invention.

The wiring board 10 (wiring body 1) in the present embodiment is used as an electrode substrate, etc. of a touch sensor of a touch panel, etc. For example, such a touch sensor is used as an input device having a function of detecting a touch position by combining the wiring board 10 (wiring body 1) and a display device (not illustrated) together. The display device is not particularly restricted, and a liquid crystal display, an organic EL display, electronic paper, etc. may be used as the display device.

For example, a touch sensor corresponding to a projection-type capacitive sensing method using two wiring boards 10 (wiring bodies 1), etc. is present as the touch sensor. In such a touch sensor, one of the two wiring boards 10 disposed to face each other is used as a detection electrode, the other one is used as a driving electrode, and a predetermined voltage is periodically applied to between the two electrodes from an external circuit (not illustrated). In addition, for example, when a finger (external conductor) of an operator approaches the touch sensor, a capacitor (capacitance) is formed between the external conductor and the touch sensor, and an electrical state between the two electrodes changes. The touch sensor may detect an operation position of the operator based on an electrical change between the two electrodes.

As illustrated in FIG. 1, the wiring board 10 includes the wiring body 1 and a substrate 2 supporting the wiring body 1. The wiring body 1 includes an adhesive layer 3 serving as an insulating member and a conductive layer 4. Use of the wiring board 10 (wiring body 1) is not particularly restricted to the above-described use.

In the present embodiment, the conductive layer 4 has a mesh shape (net shape) including straight line-shaped conductor patterns 41. In the present embodiment, a shape of each net formed by the conductor patterns 41 corresponds to a substantially square shape. However, the shape is not particularly restricted thereto. The shape of each net may correspond to the geometric forms below. That is, the shape of the net may correspond to a triangle such as a regular triangle, an isosceles triangle, a right triangle, etc., and may correspond to a rectangle such as a parallelogram, a trapezoid, etc. Alternatively, the shape of the net may correspond to an n-polygon such as a hexagon, an octagon, a dodecagon, an icosagon, etc., a circle, an ellipse, a star, etc.

In this way, a geometric form obtained by repeating various figure units may be used as the shape of each net of the conductive layer 4. In addition, in the present embodiment, the conductor pattern 41 corresponds to a straight line shape. However, the conductor pattern 41 is not particularly restricted thereto when the conductor pattern 41 linearly extends. For example, the conductor pattern 41 may correspond to a curved shape, a horseshoe shape, a zigzag line shape, etc.

A planar shape of the conductive layer 4 is not particularly restricted thereto. For example, the planar shape may correspond to a straight line rather than the mesh shape, and the conductor pattern 41 may correspond to a curved shape. In addition, the conductor pattern 41 may have a non-uniform width in planar view.

The substrate 2 is a transparent substrate that may transmit visible light and supports the wiring body 1. Examples of a material included in the substrate 2 may include polyethylene terephthalate (PET), polyethylene naphthalate (PEN), polyimide resin (PI), polyetherimide resin (PEI), polycarbonate (PC), polyether ether ketone (PEEK), liquid crystal polymer (LCP), cycloolefin polymer (COP), silicone resin (SI), acrylic resin, phenol resin, epoxy resin, green sheet, glass, etc. An easily adhesive layer or an optical adjustment layer may be formed in the substrate 2.

The adhesive layer 3 serving as the insulating member is a layer for holding the conductor pattern 41 on the substrate 2, and is made of, for example, an insulating material such as a UV-curing resin, a thermosetting resin, a thermoplastic resin, ceramic green sheet, etc. such as epoxy resin, acrylic resin, polyester resin, urethane resin, vinyl resin, silicone resin, phenol resin, polyimide resin, etc. The adhesive layer 3 includes a support portion 31 supporting the conductor pattern 41 and a smooth portion 32 covering a main surface 21 of the substrate 2 except for a part of the main surface 21 that is covered with the support portion 31, and the support portion 31 and the smooth portion 32 are integrally formed. Although not particularly restricted, a thickness of the smooth portion 32 may be set within a range of 5 µm to 100 µm.

As illustrated in FIG. 2, a cross-sectional shape (cross-sectional shape with respect to an extending direction of the conductor pattern 41) of the support portion 31 in the present embodiment corresponds to a shape, a width of which narrows in a direction away from the substrate 2 (+Z direction of FIG. 2). In addition, a boundary between the support portion 31 and the conductor pattern 41 has a concave-convex shape corresponding to a concave-convex shape of a lower surface (adhesive surface) 42 of the conductor pattern 41. Such a concave-convex shape is formed based on a surface roughness of the adhesive surface 42 of the conductor pattern 41. As illustrated in FIG. 3, a boundary between the support portion 31 and the conductor pattern 41 in a cross section along the extending direction of the conductor pattern 41 has a concave-convex shape corresponding to the concave-convex shape of the adhesive surface 42 of the conductor pattern 41. Surface roughness of the adhesive surface 42 will be described below in detail. In FIG. 2 and FIG. 3, the concave-convex shape of the boundary between the support portion 31 and the conductor pattern 41 is exaggeratingly illustrated to describe the wiring body 1 of the present embodiment in an easily understood manner.

The smooth portion 32 is provided on the whole main surface 21 of the substrate 2 at a substantially uniform height (thickness). The height of the smooth portion 32 is relatively lower than a height of the support portion 31. For this reason, the support portion 31 protrudes with respect to the smooth portion 32, and rigidity of the wiring body 1 is improved in the support portion 31. The smooth portion 32 may be formed only on a portion of the main surface 21 of the substrate 2 except for the support portion 31. Alternatively, although not particularly illustrated, the height of the smooth portion 32 may be equal to the height of the support portion 31. Alternatively, the height of the smooth portion 32 may be larger than the height of the support portion 31.

The smooth portion 32 may be omitted from the adhesive layer 3, and the adhesive layer 3 may only include the support portion 31. In this case, optical transparency of the whole wiring body 1 is improved, and thus it is possible to improve visibility in the touch panel, etc. mounted with the wiring body 1. The adhesive layer 3 in the present embodiment corresponds to an example of an insulating member of the invention.

For example, the conductive layer 4 (conductor pattern 41) is a layer that functions as an electrode in the touch sensor or a lead-out wire electrically connected to the electrode. The conductive layer 4 is formed by applying and hardening conductive paste. Specific examples of the conductive paste included in the conductive layer 4 may include conductive paste configured by mixing conductive powder or metal salt with binder resin, water, or a solvent and various addition agents. Examples of the conductive powder may include metal such as silver, copper, nickel, tin, bismuth, zinc, indium, palladium, etc., or a carbon-based material such as graphite, carbon black (furnace black, acetylene black, Ketjen black), carbon nanotube, carbon nanofiber, etc. Examples of the metal salt may include salt of the above-mentioned metal.

For example, conductive particles having a diameter φ of 0.5 µm or more and 2 µm or less (0.5≤φ≤2) depending on the width of the formed conductor pattern 41 may be used as the conductive particles contained in the conductive layer 4 (conductor pattern 41). It is preferable to use conductive particles having an average diameter φ of less than or equal to half the width of the formed conductor pattern 41 in terms of stabilizing electrical resistivity in the conductor pattern 41. In addition, when the carbon-based material is used as the conductive powder, it is preferable to use a particle whose specific surface area measured by a BET method is 20 $m^2/g$ or more.

When relatively small electrical resistivity of a certain value or less is required for the conductive layer 4 (conductor pattern 41), a metal material is preferably used as conductive powder. However, when relatively large electrical resistivity of the certain value or more is allowed for the conductive layer 4 (conductor pattern 41), a carbon-based material may be used as conductive powder. Using a carbon-based material as conductive particles is preferable in terms of improving haze or total light reflectance of a mesh film.

Examples of the binder resin contained in the conductive paste may include acrylic resin, polyester resin, epoxy resin, vinyl resin, urethane resin, phenol resin, polyimide resin, silicone resin, fluoride resin, etc. Examples of the solvent contained in the conductive paste may include α-terpineol, butyl carbitol acetate, butyl carbitol, 1-decanol, butyl cellosolve, diethylene glycol monoethyl ether acetate, tetradecane, etc. The binder resin may be omitted from the material contained in the conductive layer 4.

The width of the conductor pattern 41 is preferably within a range of 50 nm to 1,000 µm, more preferably within a range of 500 nm to 150 µm, even more preferably within a range of 1 µm to 10 µm, and further even more preferably within a range of 1 µm to 5 µm. In addition, the height of the conductor pattern 41 is preferably within a range of 50 nm to 3,000 µm, more preferably within a range of 500 nm to 450 µm, and even more preferably within a range of 500 nm to 10 µm.

The conductor pattern 41 of the present embodiment includes the adhesive surface 42, a top portion 43, and two side portions 44 and 44. The top portion 43 is positioned on an opposite side from the adhesive surface 42 in the conductor pattern 41. The top portion 43 is substantially parallel to the main surface 21 of the substrate 2 (an upper surface of the smooth portion 32 of the adhesive layer 3).

The top portion 43 includes a flat portion 431 in a cross section of the conductor pattern 41 in a width direction. The flat portion 431 is a portion having a straight line shape (that is, a portion having an extremely large radius of curvature) in the cross section of the conductor pattern 41 in the width direction, and has a flatness of 0.5 µm or less. The flatness may be measured by the JIS method (JIS B0621 (1984)).

In the present embodiment, the flatness of the flat portion 431 is obtained using a non-contact measurement scheme using laser light. Specifically, a measuring object (for example, the top portion 43 or the side portion 44) is irradiated with belt-shaped laser light, and an image of reflected light thereof is formed on an image pick-up device (for example, a two-dimensional (2D) CMOS) to measure the flatness. A scheme (maximum deflection-type flatness) is used as a scheme of calculating the flatness to set planes passing through three points separated from one another as much as possible on a target plane, and calculate a maximum value of deviations thereof as the flatness. A scheme of measuring or calculating the flatness is not particularly restricted to the above-described schemes. For example, a scheme of measuring the flatness may correspond to a contact-type measurement scheme using a dial gauge, etc. In addition, a scheme (maximum tilt-type flatness) may be used as a scheme of calculating the flatness to calculate a value of a gap, which is generated when a target plane is interposed between parallel planes, as the flatness.

The flat portion 431 of the present embodiment is formed substantially in the whole of the top portion 43. The flat portion may be formed in a portion of the top portion without being particularly restricted to the above description. In this case, for example, the flat portion may be formed in a region not including both ends of the top portion 43. When the flat portion is formed in a portion of the top portion, a width of the flat portion 431 is at least half or more a width of the top portion 43.

The side portion 44 is positioned between the adhesive surface 42 and the top portion 43. The side portion 44 has a first portion 44a connected to the top portion 43 and a second portion 44b connected to the adhesive surface 42. The second potion 44b is positioned on an outside of the first portion 44a.

A virtual straight line L (indicated by an alternated long and short dash line in FIG. 2) is a straight line passing through the first and second portions 44a and 44b in the cross section of the conductor pattern 41 in the width direction. The virtual straight line L is inclined to approach a center in the cross section of the conductor pattern 41 in the width direction as being separated from the adhesive layer 3.

The side portion 44 of the present embodiment extends to substantially match the virtual straight line L. That is, the side portion 44 is inclined such that the side portion 44 approaches the center in a cross-sectional shape of the conductor pattern 41 as the side portion is away from the adhesive layer 3. Inclined angles of the two side portions 44 and 44 in one conductor pattern 41 are substantially equal to each other.

The side portion 44 includes a flat portion 441 in the cross section of the conductor pattern 41 in the width direction. The flat portion 441 is a portion having a straight line shape (that is, a portion having an extremely large radius of curvature) in the cross section of the conductor pattern 41 in the width direction, and has a flatness of 0.5 μm or less. In the present embodiment, a portion of the side portion 44 substantially matching the virtual straight line L is included in the flat portion 441. That is, the flat portion 441 is formed substantially in the whole of the side portion 44.

A shape of the side portion 44 is not particularly restricted to the above-described shape. For example, the side portion 44 may extrude outward from the virtual straight line L in the cross section of the conductor pattern 41 in the width direction. That is, the side portion 44 preferably has a shape which is not recessed inward from the virtual straight line L (a shape in which a hem of the conductor pattern does not widen) in the cross section of the conductor pattern 41 in the width direction. In addition, in the present embodiment, the flat portion 441 is formed in the whole side portion 44. However, the invention is not particularly restricted thereto, and the flat portion 441 may be formed in a portion of the side portion 44.

The side portion 44 of the conductor pattern 41 and a side portion 311 of the support portion 31 in the adhesive layer 3 are smoothly connected to each other to form one plane. In this case, the side portion 311 of the support portion 31 preferably has a shape in which a hem of the support portion 31 does not widen in the cross section of the conductor pattern 41 in the width direction. Specifically, it is preferable to have a shape in which the side portion 311 is not recessed inward from the virtual straight line passing through a portion at which the side portion 311 and the side portion 44 are connected to each other and a portion at which the side portion 311 and the smooth portion 32 are connected to each other.

The cross-sectional shape of the conductor pattern 41 included in the conductive layer 4 is substantially a trapezoidal shape as illustrated in FIG. 2. However, the invention is not particularly restricted thereto. For example, the cross-sectional shape of the conductor pattern 41 may correspond to a square shape, a rectangular shape, etc.

Figure 4C:
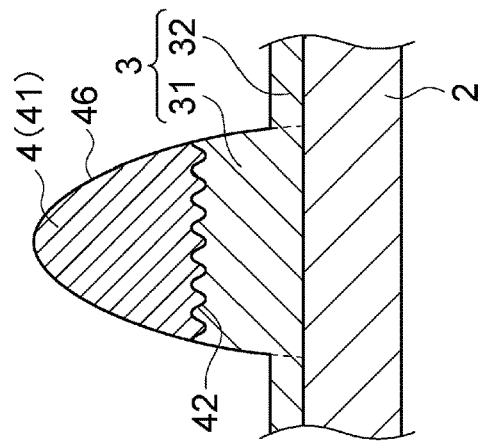
FIGS. 4(A) to 4(C) are cross-sectional views illustrating first to third modified examples of a wiring body in the embodiment of the invention.
Figure 4B:
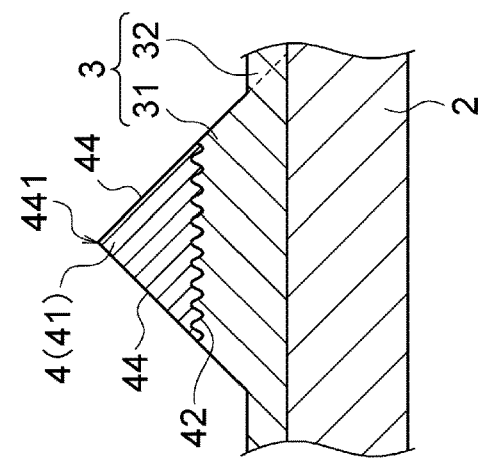
Figure 4A:
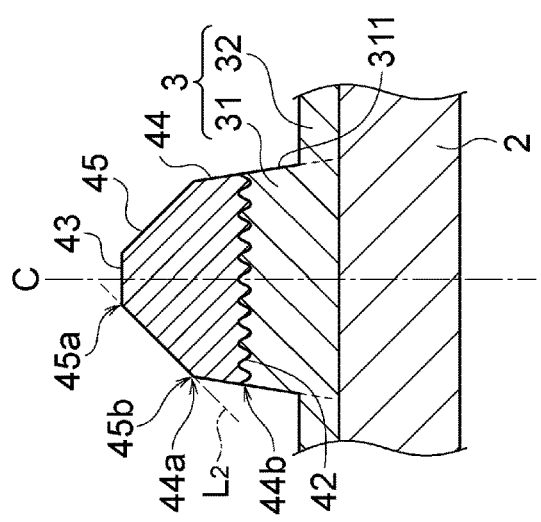

In addition, for example, as illustrated in FIG. 4(A), the cross-sectional shape of the conductor pattern 41 may include the top portion 43 and the side portion 44, and a second side portion 45 formed between the top portion 43 and the side portion 44. The second side portion 45 is formed to be inclined toward a central line C more than the side portion 44 in the cross-sectional shape of the conductor pattern 41. In the present embodiment, the second side portion 45 extends to substantially match a virtual straight line L2 passing through a third portion 45a at which the second side portion 45 and the top portion 43 are connected to each other and a fourth portion 45b at which the side portion 44 and the second side portion 45 are connected to each other. In this case, the first portion 44a of the side portion 44 is substantially identical to the fourth portion 45b of the second side portion 45. In addition, similarly to the side portion 44, the second side portion 45 preferably has a shape which is not recessed inward from the virtual straight line L2 (a shape in which the hem of the conductor pattern does not widen) in the cross section of the conductor pattern 41 in the width direction. In addition, as illustrated in FIG. 4(B), the cross-sectional shape of the conductor pattern 41 may not have the top portion 43, and right and left side portions 44 may be connected to each other at a vertex 441. Alternatively, as illustrated in FIG. 4(C), a surface except for the lower surface (adhesive surface) 42 in the conductor pattern 41 may include a curved surface 46 formed in a convex shape in a direction away from the substrate 2. In examples of FIG. 4(A) to FIG. 4(C), the cross-sectional shape of the conductor pattern 41 has a bilaterally symmetric shape. However, the cross-sectional shape may correspond to a bilaterally asymmetric shape.

In the present embodiment, the side portion 44 of the conductor pattern 41 is inclined at a predetermined angle with respect to the adhesive surface 42 (average surface). The top portion 43 of the conductor pattern 41 is substantially parallel to the main surface 21 of the substrate 2 (the upper surface of the smooth portion 32 of the adhesive layer 3) as described above. In this case, an angle θ between the side portion 44 and the top portion 43 is preferably within a range of 90° to 170° (90°≤170°), more preferably within a range of 90° to 120° (90°≤120°) in terms of suppressing diffused reflection of light in the side portion 44. In the present embodiment, an angle between one side portion 44 and the top portion 43 is substantially identical to an angle between the other side portion 44 and the top portion 43.

In addition, in the present embodiment, following Formula (3) is satisfied.

$$0.5 \leq B/A \qquad (3)$$

However, in the above Formula (3), A denotes a maximum width of the conductor pattern 41 in a section view, and B denotes a maximum height (thickness) of the conductor pattern 41 in the section view. B/A of the above Formula (3) is preferably 3 or less (B/A≤3).

In addition, in the conductor pattern 41 of the present embodiment, the top portion 43 includes the flat portion 431 (smooth surface), and the surface roughness of the adhesive surface 42 is rougher than a surface roughness of the top portion 43 including the flat portion 431. Specifically, while the surface roughness Ra of the adhesive surface 42 of the conductor pattern 41 is within a range of about 0.1 μm to 3 μm, the surface roughness Ra of the top portion 43 is within a range of about 0.001 μm to 1.0 μm. In this case, a ratio of the surface roughness of the top portion 43 to the surface roughness of the adhesive surface 42 (the surface roughness of the top portion 43 with respect to the surface roughness of the adhesive surface 42) is greater than or equal to 0.01 and less than 1. The surface roughness Ra of the adhesive surface 42 is preferably within a range of 0.1 to 0.5 μm, and the surface roughness Ra of the top portion 43 is preferably within a range of 0.001 μm to 0.3 μm. In addition, the surface roughness of the top portion 43 is preferably one fifth or less of the width (maximum width A) of the conductor pattern 41. In addition, the ratio of the surface roughness of the top portion 43 to the surface roughness of the adhesive surface 42 is preferably greater than or equal to 0.1 and less than 1.

Such a surface roughness may be measured by the JIS method (JIS B0601 (revised on Mar. 21, 2013). The surface roughness of the adhesive surface 42 and the surface roughness of the top portion 43 may be measured along a width direction in the conductor pattern 41 (see FIG. 2). The roughness may be measured along an extending direction in the conductor pattern 41 (see FIG. 3).

Incidentally, as described in the JIS method (JIS B0601 (revised on Mar. 21, 2013), the "surface roughness Ra" herein refers to an "arithmetic average roughness Ra". This "arithmetic average roughness Ra" refers to a roughness parameter obtained by excluding a long wavelength component (waviness component) from a profile curve. The waviness component is separated from the profile curve based on a measurement condition (for example, dimensions of an object, etc.) necessary to obtain a form.

In addition, in the present embodiment, the side portion 44 includes the flat portion 441. Further, similarly to the top portion 43, the surface roughness of the adhesive surface 42 is rougher than the surface roughness of the side portion 44 including the flat portion 441. Specifically, the surface roughness Ra of the side portion 44 is within a range of about 0.001 μm to 1.0 μm with respect to the surface roughness Ra of the adhesive surface 42. The surface roughness Ra of the side portion 44 is preferably within a range of about 0.001 μm to 0.3 μm. The surface roughness of the side portion 44 may be measured along the width direction in the conductor pattern 41 (see FIG. 2), or may be measured along the extending direction in the conductor pattern 41 (see FIG. 3).

When the top portion 43 include the flat portion 431, and the side portion 44 includes the flat portion 441, a diffused reflectance of the wiring body 1 on a surface side except for the adhesive surface 42 (that is, a surface side including the top portion 43 and the side portion 44) is relatively smaller than a diffused reflectance of the wiring body 1 on the adhesive surface 42 side. Specifically, a ratio of the diffused reflectance of the wiring body 1 on the surface side except for the adhesive surface 42 to the diffused reflectance of the wiring body 1 on the adhesive surface 42 side (the diffused reflectance of the wiring body 1 on the surface side except for the adhesive surface 42 with respect to the diffused reflectance of the wiring body 1 on the adhesive surface 42 side) is greater than or equal to 0.1 and less than 1, and preferably greater than or equal to 0.3 and less than 1.

Figure 5:
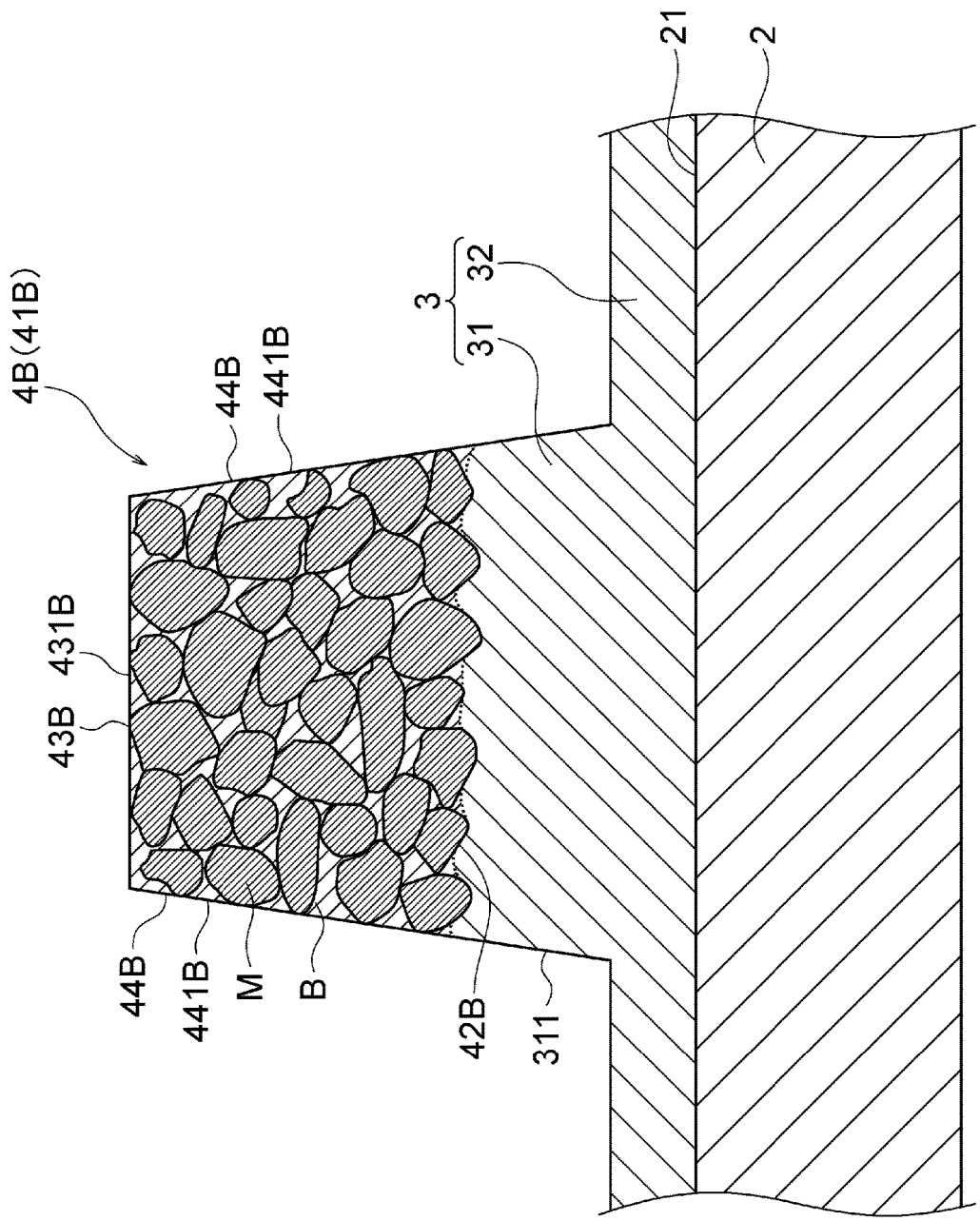
FIG. 5 is a cross-sectional view for description of a conductive layer in the embodiment of the invention.
Figure 8A:
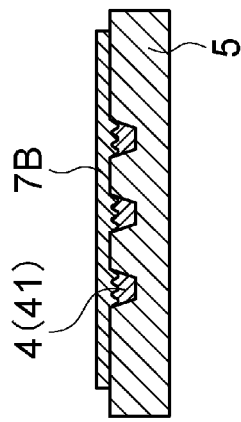
FIGS. 8(A) to 8(E) are cross-sectional views illustrating modified examples of the method for producing the wiring board in the embodiment of the invention.
Figure 8B:
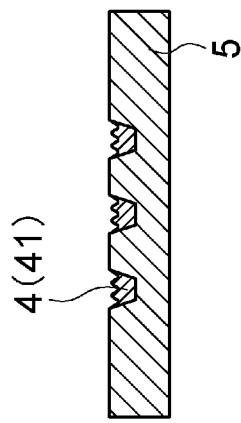
Figure 8C:
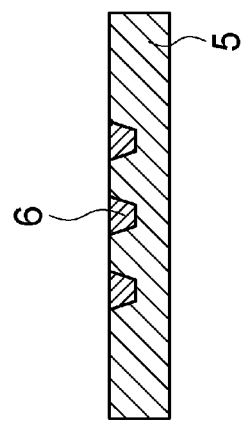
Figure 8D:
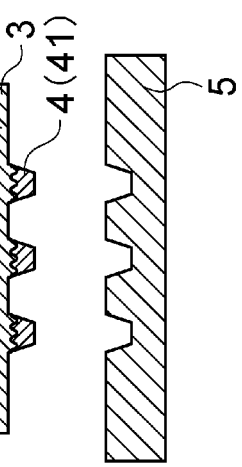
Figure 8E:
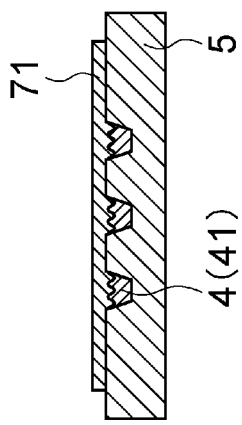

A description will be given of an example of a shape of a conductor pattern 41B having the above-described relative relation between an adhesive surface and another surface with reference to FIG. 5. As illustrated in FIG. 5, in the conductor pattern 41B containing conductive particles M and a binder resin B, conductive particles M is dispersed in the binder resin B. In addition, in a cross section of the conductor pattern 41B in a width direction, some of the conductive particles M protrude from the binder resin B on an adhesive surface 42B. In this way, the adhesive surface 42B has a concave-convex shape. Meanwhile, in the cross section of the conductor pattern 41B in the width direction, the binder resin B penetrates between conductive particles M and covers the conductive particles M in a top portion 43B and a side portion 44B. In this way, a flat portion 431B is formed in the top portion 43B. In addition, a flat portion 441B is formed in the side portion 44B. When the conductive particles are covered with the binder resin in the top portion 43B and the side portion 44B, electric insulation between adjacent conductor patterns 41 is improved, and occurrence of migration is suppressed.

In a mode illustrated in FIG. 5, a surface roughness of the adhesive surface 42B is relatively large due to some of the conductive particles M protruding from the binder resin B on the adhesive surface 42B. Meanwhile, in the top portion 43B, a surface roughness of the top portion 43B is relatively small due to the conductive particles M covered with the binder resin B. In this way, the surface roughness of the adhesive surface 42B is rougher than the surface roughness of the top portion 43B.

In addition, in the side portion 44B, similarly to the top portion 43B, a surface roughness of the side portion 44B is relatively small due to the conductive particles M covered with the binder resin B. In this way, the surface roughness of the adhesive surface 42B is rougher than the surface roughness of the side portion 44B. Shapes of the adhesive surface, the top portion, and the side portion are not restricted to the mode illustrated in FIG. 5 when the above-described relative relation with regard to the surface roughness is satisfied.

Next, a description will be given of a method for producing the wiring board 10 in the present embodiment. FIG. 6(A) to FIG. 6(E) are cross-sectional views for description of the method for producing the wiring board in the present embodiment.

First, as illustrated in FIG. 6(A), intaglio 5 in which a recessed portion 51 having a shape corresponding to the mesh shape of the conductive layer 4 is prepared. Examples of a material contained in the intaglio 5 may include glass of nickel, silicon, silicon dioxide, etc., ceramic, organic silica, glassy carbon, a thermoplastic resin, a light curing resin, etc.

A width of the recessed portion 51 is preferably within a range of 50 nm to 1,000 nm, more preferably within a range of 500 nm to 150 μm, even more preferably within a range of 1 μm to 10 μm, and further even more preferably within a range of 1 μm to 5 μm. In addition, a height of the recessed portion 51 is preferably within a range of 50 nm to 3,000 μm, more preferably within a range of 500 nm to 450 μm, and even more preferably within a range of 500 nm to 10 μm.

An inner wall 52 of the recessed portion 51 in the present embodiment corresponds to a flat surface, and the inner wall 52 is inclined such that a width thereof is narrowed toward a bottom surface 53 of the recessed portion 51 (see a drawn diagram of FIG. 6(A)). A release layer made of a graphite-based material, a silicone-based material, a fluorine-based material, a ceramic-based material, an aluminum-based material, etc. is preferably formed on a surface of the intaglio 5 including the recessed portion 51 in order to improve a release property.

The recessed portion 51 of the intaglio 5 is filled with an electrically conductive material 6 (first process). The above-described conductive paste is used as the electrically conductive material 6. Alternatively, it is possible to use a material to which conductivity is assigned through heating. Examples of a method of filling the recessed portion 51 of the intaglio 5 with the electrically conductive material 6 may include a dispensing method, an ink-jet method, screen printing, etc. Otherwise, the examples may include a method in which after coating using a slit coating method, a bar coating method, a blade coating method, a dip coating method, a spray coating method, or a spin coating method, an electrically conductive material coated in a portion other than the recessed portion is removed by wiping, scraping, sucking, sticking, washing, or blowing. A composition, etc. of the electrically conductive material may be appropriately used properly according to a shape of the intaglio, etc.

Subsequently, as illustrated in FIG. 6(B), the conductor pattern 41 included in the conductive layer 4 is formed by heating the electrically conductive material 6 filling the recessed portion 51 of the intaglio 5. A condition for heating the electrically conductive material 6 may be appropriately set depending on the composition of the electrically conductive material 6, etc.

The electrically conductive material 6 contracts in volume through this heating process. In this instance, an external surface of the electrically conductive material 6 except for an upper surface 47 is formed in a shape having a flat surface along the inner wall 52 and the bottom surface 53 of the recessed portion 51. Meanwhile, the upper surface 47 of the electrically conductive material 6 filling the recessed portion 51 is heated while coming into contact with an external atmosphere. For this reason, a concave-convex shape based on the shape of the conductive particles contained in the electrically conductive material 6 is formed on the upper surface 47 of the conductor pattern 41 (second process). The electrically conductive material 6 is heated and hardened in the present process, and thus wet spreading does not occur even when the electrically conductive material 6 is taken out from the recessed portion 51 of the intaglio 5 in a subsequent process. A method of processing the electrically conductive material is not restricted to heating. The electrically conductive material may be irradiated with an energy ray such as an infrared ray, an ultraviolet ray, laser light, or may only be dried. Alternatively, two or more types of these processing methods may be combined.

In addition, in this instance, following Formula (4) is satisfied.

$$0.5 \le D/C \quad (4)$$

However, in the above Formula (4), C denotes a maximum width of the electrically conductive material 6 in a section view, and D denotes a maximum height (thickness) of the heated electrically conductive material 6 in the section view (see a drawn diagram of FIG. 4(B)). D/C of the above Formula (4) is preferably 3 or less (D/C≤3).

Subsequently, as illustrated in FIG. 6(C), an adhesive material 7 for forming the adhesive layer 3 is disposed on the intaglio 5. The above-described material contained in the adhesive layer 3 is used as the adhesive material 7. Examples of a method of disposing the adhesive material 7 on the intaglio 5 include screen printing, a spray coating method, a bar coating method, a dip method, an ink-jet method, etc. Through this application, the adhesive material 7 introduces into the recessed portion 51 including a concave of the concave-convex shape of the conductor pattern 41 (third process).

Subsequently, as illustrated in FIG. 6(D), the substrate 2 is disposed from above the adhesive material 7 applied onto the intaglio 5. This disposition is preferably performed in a vacuum in order to inhibit a bubble from penetrating between the adhesive material 7 and the substrate 2. Examples of a material of the substrate may include the above-described materials. An easily adhesive layer or an optical adjustment layer may be formed in the substrate. Subsequently, the adhesive material 7 is hardened. Examples of a method of hardening the adhesive material may include irradiating with an energy ray such as an infrared ray, an ultraviolet ray, laser light, etc., heating, annealing, drying, etc. In this way, the adhesive layer 3 is formed, and the substrate 2 and the conductor pattern 41 are bonded and fixed to each other through the adhesive layer 3.

In the present embodiment, the substrate 2 is stacked after the adhesive material 7 is disposed onto the intaglio 5. However, the invention is not particularly restricted thereto. For example, the substrate 2 may be stacked on the intaglio 5 through the adhesive material 7 by disposing, on the intaglio 5, a layer obtained by applying the adhesive material 7 to the main surface (surface facing the intaglio 5) of the substrate 2 in advance.

Subsequently, the substrate 2, the adhesive layer 3, and the conductive layer 4 may be released from a mold (fourth process), thereby obtaining the wiring board 10 (wiring body 1) (see FIG. 6(E)). The wiring body illustrated in FIG. 4(A) to 4(C) may be produced similarly to the above description using intaglio that has recessed portions corresponding to the shapes of the conductor pattern 41 and the support portion 31.

Next, a description will be given of an effect of the wiring body 1 and the method for producing the same in the present embodiment. FIG. 7 is a cross-sectional view for description of the effect of the wiring body in the present embodiment.

In the wiring body 1 of the present embodiment, a focus is on relative relation between surface roughness (that is, a roughness parameter obtained by excluding a wavelength component) of the adhesive surface 42 in the conductor pattern 41 and surface roughness of another surface which is a surface of the conductor pattern 41 except for the adhesive surface 42 (the surface including the top portion 43 and the side portion 44), and the surface roughness Ra of the adhesive surface 42 is set to be relatively rougher than the surface roughness Ra of the other surface. For this reason, it is possible to suppress diffused reflection of light entering from the outside while strongly bonding the adhesive layer 3 and the conductor pattern 41 together. In particular, when the width of the conductor pattern 41 is within a range of 1 μm to 5 μm, and when the relative relation between the surface roughness of the adhesive surface 42 and the surface roughness of the other surface satisfies the above-described relation, it is possible to noticeably accomplish the effect that diffused reflection of light entering from the outside may be suppressed while strongly bonding the adhesive layer 3 and the conductor pattern 41 together.

In addition, when the wiring body 1 in the present embodiment is produced, the electrically conductive material 6 is heated after filling the recessed portion 51 of the intaglio 5 with the electrically conductive material 6 as described above. In this way, the bottom surface of the electrically conductive material 6 after heating has a flat portion corresponding to the flat surface of the bottom surface 53 of the recessed portion 51. For this reason, the top portion 43 of the conductor pattern 41 included in the conductive layer 4 has the flat portion 431. In this way, when the wiring body 1 is used as an electrode substrate of a touch panel, etc., it is possible to further suppress diffused reflection of light entering from the outside of the wiring body 1. As a result, it is possible to improve visibility of the touch panel, etc. mounted with the wiring body 1.

Similarly, in the present embodiment, a side surface of the electrically conductive material 6 after heating includes a flat portion corresponding to a flat surface of the inner wall 52 of the recessed portion 51. For this reason, the side portion 44 of the conductor pattern 41 included in the conductive layer 4 includes the flat portion 441. In this way, when the wiring body 1 is used as the electrode substrate of the touch panel, etc., it is possible to further suppress diffused reflection of light entering from the outside of the wiring body 1. As a result, it is possible to further improve visibility of the touch panel, etc. mounted with the wiring body 1.

In addition, as illustrated in FIG. 7, in the case in which a coat layer 8 made of a resin material, etc. is provided around the conductor pattern 41 when the wiring body 1 is used for the touch panel, etc., a bubble is rarely formed around a surface of the conductor pattern 41 when the top portion 43 of the conductor pattern 41 includes the flat portion 431. In this way, it is possible to inhibit light entering from the outside of the wiring body 1 from diffusing on the bubble when the wiring body 1 is used as the electrode substrate, etc. of the touch panel. For this reason, it is possible to further improve visibility of the touch panel, etc. mounted with the wiring body 1. In addition, when a bubble is rarely formed around the surface of the conductor pattern 41, it is possible to inhibit the conductor pattern 41 from being corroded by water present inside the bubble.

Similarly, when the side portion 44 of the conductor pattern 41 includes the flat portion 441, a bubble is rarely formed around the surface of the conductor pattern 41. In this way, it is possible to inhibit light entering from the outside of the wiring body 1 from diffusing on the bubble when the wiring body 1 is used as the electrode substrate, etc. of the touch panel. For this reason, it is possible to further improve visibility of the touch panel, etc. mounted with the wiring body 1. In addition, when a bubble is rarely formed around the surface of the conductor pattern 41, it is possible to inhibit the conductor pattern 41 from being corroded by water present inside the bubble.

In addition, in the wiring body 1 illustrated in FIG. 7, even when light entering the inside of the wiring body 1 from the outside of the coat layer 8 side is reflected on the side portion 44 of the conductive layer 4, reflected light rarely leaks out to the outside from the coat layer 8 side. It is possible to further improve visibility of the touch panel, etc. by mounting the wiring body 1 in the touch panel, etc.

When the top portion 43 includes the flat portion 431 in the cross-sectional shape of the conductor pattern 41 in the width direction, an external surface 81 of the coat layer 8 is easily formed in a flat shape. In this way, when a film (not illustrated) is provided on the external surface 81 of the coat layer 8, it is possible to suppress generation of distortion in the film while stably holding the film by the external surface 81 of the coat layer 8.

In addition, in the present embodiment, the side portion 44 extends to substantially match the virtual straight line L passing through the first and second portions 44a and 44b. In this case, since the side portion does not have a shape recessed inward from the virtual straight line (a shape in which a hem of the conductor pattern widens) in the cross section of the conductor pattern in the width direction, diffused reflection of light entering from the outside of the wiring body 1 is suppressed. It is possible to further improve visibility of the touch panel, etc. by mounting the wiring body 1 in the touch panel, etc.

In addition, in the present embodiment, when the surface roughness Ra of the adhesive surface 42 is set to be relatively rougher than the surface roughness Ra of another surface which is a surface of the conductor pattern 41 except for the adhesive surface 42 (the surface including the top portion 43 and the side portion 44), a diffused reflectance of the wiring body 1 on the other surface side is relatively smaller than a diffused reflectance of the wiring body 1 on the adhesive surface 42 side. Herein, when the diffused reflectance of the wiring body 1 is small, it is possible to inhibit the conductor pattern 41 from appearing white, and to suppress a decrease in contract in a region in which the conductor pattern 41 may be visually recognized. In this way, it is possible to further improve visibility of the touch panel, etc. mounted with the wiring body 1 of the present embodiment.

In addition, when the wiring body 1 of the present embodiment is produced, a concave-convex shape based on the shape of the conductive particles contained in the electrically conductive material 6 is formed on the upper surface 47 of the electrically conductive material 6 after heating. That is, the concave-convex shape is formed on the lower surface (adhesive surface) 42 of the conductor pattern 41 included in the conductive layer 4. It is possible to increase a contact area between the conductor pattern 41 and the adhesive layer 3, and to strongly bond the conductor pattern 41 and the adhesive layer 3 together by the concave-convex shape. Meanwhile, a contact surface between the conductor pattern 41 and the intaglio 5 has a flat shape. For this reason, it is possible to improve a release property when the conductor pattern 41 is released from the intaglio 5. In the present embodiment, the inner wall 52 of the recessed portion 51 of the intaglio 5 is inclined with respect to the upper surface 47 (the adhesive surface 42) of the electrically conductive material 6 (the conductive layer 4), and the width of the recessed portion 51 is narrowed toward the bottom surface 53, and thus this effect may be further improved. Inclining the inner wall 52 of the recessed portion 51 as described above contributes to improving a filling property when the inner wall 52 is filled with the electrically conductive material 6 (see FIG. 4(A)).

In addition, when the conductor pattern 41 and the adhesive layer 3 may be strongly bonded together, the conductor pattern 41 may be inhibited from being peeled off from the adhesive layer 3 by the wiring body 1 being curved or bent, and thus durability of the wiring body 1 may be improved.

Further, the cross-sectional shape of the electrically conductive material 6 (the conductor pattern 41) after heating may be set to a shape satisfying the above Formula (3) and Formula (4) by the effect that the release property is improved when the conductor pattern 41 is released from the intaglio 5. In this way, it is possible to increase a cross-sectional area of the conductor pattern 41, and to decrease an electrical resistance value per unit length of the conductor pattern 41. This effect is further improved when the inequalities $B/A \leq 3$ and $D/C \leq 3$ are satisfied.

The above-described effect may be similarly accomplished when the conductor pattern 41 has the shape illustrated in FIG. 4(A) to FIG. 4(C).

The above-described embodiment has been described to facilitate understanding of the invention, and has not been described to restrict the invention. Therefore, each element disclosed in the above embodiment is intended to include all changes of design or equivalents falling within a technical scope of the invention.

For example, a wiring body 1B may be produced using a producing method illustrated in FIG. 8(A) to FIG. 8(E). Specifically, after the intaglio 5 is filled with the electrically conductive material 6 and heated (FIG. 8(A) and FIG. 8(B)), an adhesive material 7B is disposed on the intaglio 5 (FIG. 8(C)), and the adhesive material 7B is hardened (FIG. 8(D)). Then, the wiring body 1B having the hardened adhesive material 7B (the adhesive body 71) used as a substrate may be produced by releasing the electrically conductive material 6 (the conductor pattern 41) and an adhesive body 71 after heating from the intaglio 5. The wiring body 1B produced in this way may accomplish a similar effect to that of the above-described wiring body 1.

In addition, the touch sensor of the above embodiment is a touch sensor corresponding to a projection-type capacitive sensing method using two wiring boards 10 (wiring bodies 1). However, the invention is not restricted thereto. The invention is applicable to a touch sensor corresponding to a surface-type (capacitive coupling-type) capacitive sensing method using one wiring board (wiring body).

In addition, a metal material mixed with a carbon-based material may be used as the conductive powder of the conductive layer 4 (conductor pattern). In this case, for example, the carbon-based material may be disposed on the top portion side of the conductor pattern, and the metal-based material may be disposed on the adhesive surface side thereof. Alternatively, reversely, the metal-based material may be disposed on the top portion side of the conductor pattern, and the carbon-based material may be disposed on the adhesive surface side thereof.

In addition, although not particularly illustrated, the substrate 2 may be omitted from the wiring body 1 in the above-described embodiment. In this case, for example, the wiring body may be configured in a mode in which a release sheet is provided on a lower surface of the adhesive layer 3, and the wiring body is mounted by peeling off the release sheet and bonding the wiring body to a mounting object (a film, surface glass, a polarizing plate, display glass, etc.) at the time of amounting. Alternatively, it is possible to employ a mode in which a resin portion covering the wiring body 1 from the insulating member side is further provided, and the wiring body 1 is mounted by being bonded to the above-mentioned mounting object through the resin portion. Alternatively, it is possible to employ a mode in which a resin portion covering the wiring body 1 from the conductive layer 4 side is provided, and the wiring body 1 is mounted by being bonded to the above-mentioned mounting object through the resin portion. In these cases, the mounting object on which the wiring body is mounted corresponds to an example of a support of the invention.

Further, in the above-described embodiment, a description has been given on the assumption that the wiring body is used for the touch sensor, etc. However, the invention is not particularly restricted thereto. For example, the wiring body may be used as a heater by electrifying the wiring body to generate heat using resistance heating, etc. In this case, a carbon-based material having relatively high electrical resistivity is preferably used as conductive powder of the conductive layer (conductor pattern). Alternatively, the wiring body may be used as an electromagnetic shield by grounding a part of a conductive portion of the wiring body. Alternatively, the wiring body may be used as an antenna. In this case, a mounting object on which the wiring body is mounted corresponds to an example of the support of the invention.

EXPLANATIONS OF LETTERS OR NUMERALS 10 wiring board
1, 1B wiring body
   2 substrate
   3 adhesive layer
      31 support portion
      32 smooth portion
   4 conductive layer
      41 conductor pattern
      42 lower surface (adhesive surface)
      43 top portion
         431 flat portion
      44 side portion
         44a, 44b first and second portions
         441 flat portion
      45 second side portion
      46 curved surface
      47 upper surface
   5 intaglio
      51 recessed portion
      52 inner wall
      53 bottom surface
   6 electrically conductive material
   7, 7B adhesive material

The invention claimed is:

1. A wiring body comprising:
an insulating member; and
a conductor pattern bonded to the insulating member and comprising conductive particles and binder resin, wherein
the conductor pattern is bonded to the insulating member after the conductor pattern is cured,
the conductor pattern includes:
   an adhesive surface bonded to the insulating member; and
   another surface that is a surface of the conductor pattern except for the adhesive surface, and
a surface roughness of the adhesive surface is rougher than a surface roughness of the another surface, wherein
a part of the conductive particles protrudes from the binder resin on an adhesive surface of the conductor pattern bonded to the insulating member, and
a boundary, formed after the insulating member is disposed on the cured conductor pattern, between the insulating member and the conductor pattern has a concave-convex shape corresponding to a concave-convex shape based on the surface roughness of the adhesive surface.

2. The wiring body according to claim 1, wherein the following Formula (1) is satisfied:

$$0.5 \leq B/A \qquad (1)$$

in the Formula (1), A denotes a maximum width of the conductor pattern in a section view, and B denotes a maximum height of the conductor pattern in the section view.

3. The wiring body according to claim 1, wherein the another surface includes a top portion positioned on an opposite side to the adhesive surface, and the top portion includes a flat portion.

4. The wiring body according to claim 1, wherein
the another surface includes:
   a top portion positioned on an opposite side to the adhesive surface; and
   a side portion positioned between the adhesive surface and the top portion, and
the side portion is inclined such that the side portion approaches a center of the conductor pattern as the side portion is away from the insulating member in a section view.

5. The wiring body according to claim 4, wherein
an angle θ between the top portion and the side portion is within a range of 90° to 120°.

6. The wiring body according to claim 4, wherein
the side portion includes:
   a first portion connected to the top portion in the section view; and
   a second portion positioned on an outside of the first portion and connected to the adhesive surface in the section view, and
the side portion substantially matches a virtual straight line passing through the first and second portions in the section view, or protrudes outward from the virtual straight line in the section view.

7. The wiring body according to claim 1, wherein
an average diameter of the conductive particles is half or less of a width of the conductor pattern.

8. The wiring body according to claim 1, wherein a width of the conductor pattern is within a range of 1 μm to 5 μm.

9. The wiring body according to claim 1, wherein a diffused reflectance of the wiring body on a side of the another surface is relatively smaller than a diffused reflectance of the wiring body on a side of the adhesive surface.

10. A wiring board comprising:
the wiring body according to claim 1; and
a support that supports the wiring body.

11. A touch sensor comprising:
the wiring board according to claim 10.

12. The wiring body according to claim 1, wherein
each of the conductive particles has a diameter of 0.5 μm or more and 2 μm or less.

13. The wiring body according to claim 1, wherein
the surface roughness of the adhesive surface is within a range of 0.1 μm to 3 μm.

14. A method for producing a wiring body, comprising:
a first process of filling a recessed portion of intaglio with an electrically conductive material comprising conductive particles and binder resin;
a second process of forming a concave-convex shape on an upper surface of the electrically conductive material by performing at least one of drying, heating, and irradiating with an energy ray the electrically conductive material filling the intaglio, wherein the concave-convex shape is formed by the conductive particles that protrude from the binder resin;
a third process of disposing an insulating material on the concavo-convex shape after the second process so that the insulating material is introduced into a concave of the concavo-convex shape; and
a fourth process of releasing at least the insulating material and the electrically conductive material from the intaglio.

15. The method for producing a wiring body according to claim 14, wherein
the third process includes a process of disposing a substrate on the insulating material disposed on the concave-convex shape, and
the fourth process is a process of releasing the substrate, the insulating material, and the electrically conductive material from the intaglio while the electrically conductive material is fixed to the substrate through the insulating material.

16. A wiring body comprising:
an insulating member; and
a conductor pattern bonded to the insulating member, wherein
the conductor pattern is bonded to the insulating member after the conductor pattern is cured,
the conductor pattern includes:
   an adhesive surface bonded to the insulating member; and
   another surface that is a surface of the conductor pattern except for the adhesive surface,
a surface roughness of the adhesive surface is rougher than a surface roughness of the another surface,
the another surface includes a top portion positioned on an opposite side to the adhesive surface, and
the top portion includes a flat portion.

* * * * *